United States Patent [19]

Baldwin et al.

[11] Patent Number: 5,971,597
[45] Date of Patent: *Oct. 26, 1999

[54] MULTIFUNCTION SENSOR AND NETWORK SENSOR SYSTEM

[75] Inventors: John R. Baldwin, Newtown; Thomas J. Batko, Wallingford; David F. Ellison, Westport, all of Conn.

[73] Assignee: Hubbell Corporation, Orange, Conn.

[*] Notice: This patent issued on a continued prosecution application filed under 37 CFR 1.53(d), and is subject to the twenty year patent term provisions of 35 U.S.C. 154(a)(2).

[21] Appl. No.: 08/738,044

[22] Filed: Oct. 25, 1996

Related U.S. Application Data

[63] Continuation-in-part of application No. 08/412,502, Mar. 29, 1995, Pat. No. 5,699,243, and application No. 08/705,778, Aug. 30, 1996, Pat. No. 5,772,326.

[51] Int. Cl.$^6$ .................................................. G08B 13/19
[52] U.S. Cl. .............................. 364/528.12; 364/528.1; 364/528.11; 340/540; 340/567
[58] Field of Search ..................................... 340/540–541, 340/825.01, 567; 364/557, 198, 156, 528.1, 528.11, 528.12

[56] References Cited

U.S. PATENT DOCUMENTS

| | | | |
|---|---|---|---|
| 4,688,183 | 8/1987 | Carll | 364/554 |
| 4,703,171 | 10/1987 | Kahl | 250/221 |
| 5,106,325 | 4/1992 | Robinson et al. . | |
| 5,115,967 | 5/1992 | Wedekind . | |
| 5,266,807 | 11/1993 | Neiger . | |
| 5,281,961 | 1/1994 | Elwell | 340/825 |
| 5,290,175 | 3/1994 | Robinson et al. . | |
| 5,395,042 | 3/1995 | Riley et al. . | |
| 5,430,663 | 7/1995 | Judd | 364/550 |
| 5,479,812 | 1/1996 | Juntunen et al. . | |
| 5,509,108 | 4/1996 | Yeh . | |
| 5,525,846 | 6/1996 | Newell et al. . | |
| 5,565,855 | 10/1996 | Knibbe | 340/825.06 |
| 5,640,143 | 6/1997 | Myron | 340/541 |
| 5,699,243 | 12/1997 | Eckel et al. . | |

*Primary Examiner*—James P. Trammell
*Assistant Examiner*—Matthew Smithers
*Attorney, Agent, or Firm*—Jerry M. Presson; William C. Roch

[57] ABSTRACT

A multifunction sensor provides a plurality of parameter sensors in one sensor module which can interface with and control operation of one or more processor control systems in an occupied space networked environment such as a commercial building. The multifunction sensor comprises at least an occupancy sensor, an ambient light sensor, and a temperature sensor. A common network communications and control processor is coupled to a common communication transceiver, and are shared in common by the occupancy sensor, the ambient light sensor and the temperature sensor, such that the multifunction sensor can interface with and control operation of one or more processor control systems. A plurality of the multifunction sensors are placed at different locations throughout the building. The multifunction network sensor system further comprises energy management and security controller systems, and a common data communication network which connects to the multifunction sensors and the controller systems to form a local operating network in the building. Each multifunction sensor is assigned a unique location address, and can transmit and receive data, including its own unique address, over the data communication network.

25 Claims, 9 Drawing Sheets

MULTIFUNCTION SENSOR AND NETWORK SENSOR SYSTEM

This patent application is a continuation-in-part application of U.S. patent application Ser. No. 08/412,502, filed Mar. 29, 1995, now U.S. Pat. No. 5,699,243 for a Motion Sensing System With Adaptive Timing for Controlling Lighting Fixtures and of U.S. patent application Ser. No. 08/705,778, filed Aug. 30, 1996, now U.S. Pat. No. 5,772,326, for a Temperature and Passive Infrared Sensor Module.

This patent application is also related to U.S. patent application Ser. No. 08/738,045, filed Mar. 18, 1998, and patent application Serial. No. 08/736,864, filed Mar. 18, 1998.

BACKGROUND OF THE INVENTION

1. Field of the Invention

The present invention relates generally to a multifunction sensor and network sensor system, and more particularly pertains to a multifunction sensor and network sensor system as might be utilized in an occupied space networked environment such as an automated commercial or industrial building in which sensors are installed to sense and control various parameters therein. The sensors can include an occupancy sensor, such as a passive infrared (PIR) sensor or an active infrared sensor or an ultrasonic sensor, a temperature sensor, an ambient light sensor, a relative humidity sensor, a $CO_2$ sensor, a time of day sensor, and other parameter sensors.

It would be desirable to provide a plurality of such parameter sensors in one sensor module which can interface with one or more processor control systems to control operation of security systems, energy management systems, etc. in the occupied space networked environment. Such processor control systems are available commercially which incorporate networking such as an Echelon LONWORKS system, CEBus, BacNet, etc.

2. Discussion of the Prior Art

Traditionally, separate sensors have been used for occupancy sensing, ambient light sensing, temperature sensing, etc. in separate lighting control systems, Heating, Ventilation and Air Conditioning (HVAC) control systems, Demand Side Managerrent (DSM) electrical load control systems, and security systems, although modules combining occupancy sensing and ambient light sensing have been used in nonnetworked systems.

SUMMARY OF THE INVENTION

Accordingly, it is a primary object of the present invention to provide a multifunction sensor and network sensor system.

A further object of the subject invention is the provision of a multifunction sensor and network sensor system which provides major cost benefits in building and installing automatic control systems in automated commercial or industrial buildings, with additional major cost savings in installation and binding (software connectivity allowing interoperability) of a node to other control nodes in a control system network. The cost of one multifunction sensor module, as compared with separate sensor modules for occupancy, ambient light, and temperature, should greatly reduce the equipment and installation costs. The cost savings result from shared usage of common hardware, software and enclosures, such as a common network control and communications processor and a common communication transceiver between multiple sensors, and the elimination of multiple sensor housings, as well as from the more simplified installation procedures for a single multifunction sensor.

In accordance with the teachings herein, the present invention provides a multifunction sensor providing a plurality of parameter sensors in one sensor module which can interface with and control operation of one or more processor control systems in an occupied space networked environment. The multifunction sensor comprises at least an occupancy sensor, an ambient light sensor, and a temperature sensor. A common network communications and control processor is coupled to a common communication transceiver, and are shared in common by the occupancy sensor, the ambient light sensor, and the temperature sensor, such that the multifunction sensor can interface with and control operation of one or more processor control systems in the occupied space networked environment.

In greater detail, the multifunction network sensor system further comprises energy management and security controller systems, and a common data communication network which connects to the multifunction sensor and the controller systems to form a local operating network in a building. A plurality of the multifunction sensors are placed at different locations throughout the building. Each multifunction sensor is assigned a unique location address, and can transmit and receive data, including its own unique address, over the data communication network.

The local operating network includes one or more lighting controllers which receive data on occupancy or intrusion and ambient light from one or more of the multifunction sensors, one or more security controllers which receive data on occupancy from one or more of the multifunction sensors, one or more heating, ventilation and air conditioning controllers which receive data on occupancy and temperature from one or more of the multifunction sensors, one or more demand side management. controllers which control and manage electrical loads dependent upon electrical demand and which receive data on occupancy, temperature and ambient light from one or more of the multifunction sensors, and one or more presence monitors which receive data on occupancy from one or more of the multifunction sensors.

The data communication network can be connected by any suitable transmission medium such as a twisted wire pair, and can employ any suitable common bus data communications protocol such as a Carrier Sense Multiple Access (CSMA) protocol as employed by LONWORKS, CEBus, or BacNet. The plurality of multifunction sensors can include a wallmount multifunction sensor mounted flush upon a wall or in a corner, a ceiling mount multifunction sensor mounted flush upon a ceiling, and a wall switch multifunction sensor mounted recessed in a wall switch receptacle box mounted recessed in a wall. The multifunction sensor can be mounted in hallways, rooms or open office cubicles, each provided with a lens designed to optimize the field of view and motion detection for that particular application. Each multifunction sensor may also include an analog to digital converter, installer interface network controls, and one or more network communication transceivers configurable to any function.

BRIEF DESCRIPTION OF THE DRAWINGS

The foregoing objects and advantages of the present invention for a multifunction sensor and network sensor system may be more readily understood by one skilled in the art with reference being had to the following detailed description of several preferred embodiments thereof, taken in conjunction with the accompanying drawings wherein like elements are designated by identical reference numerals throughout the several views, and in which:

FIGS. 2, 3 and 4 illustrate three different types of multifunction sensors pursuant to the present invention, a wallmount multifunction sensor, a ceiling mount multifunction sensor, and a wall switch multifunction sensor, each of which could be utilized in the multifunction network sensor system of FIG. 1 and wherein

DETAILED DESCRIPTION OF THE DRAWINGS

Figure 1:
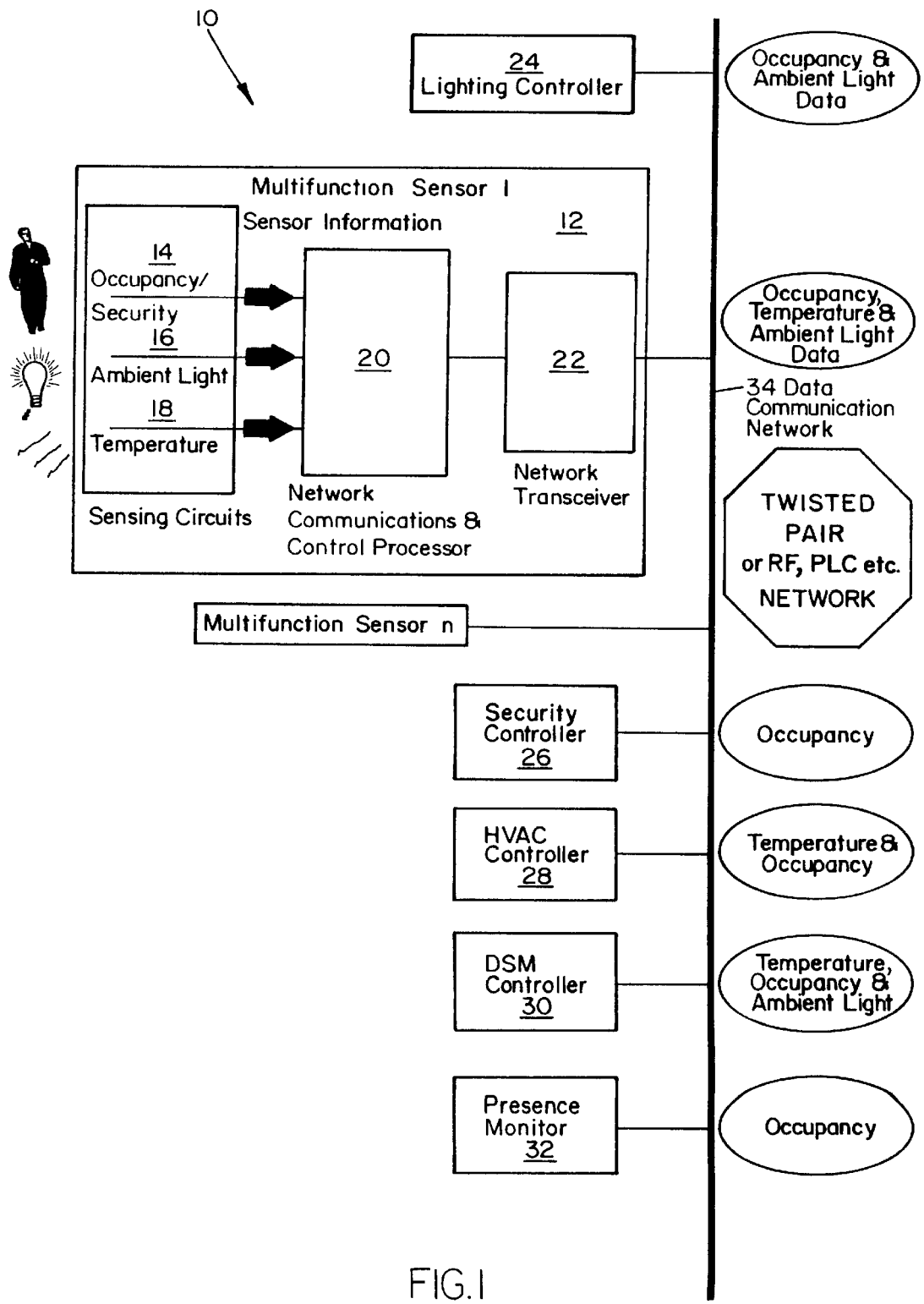
FIG. 1 is a block diagram of a multifunction network sensor system pursuant to the present invention which comprises multifunction sensors, each of which generally includes at least an occupancy sensor, a temperature sensor and an ambient light sensor, all of which share the same network communications and control processor and the same network communication transceiver, and a plurality of energy management and security controller systems, all of which are connected to a common data communication network.

Referring to the drawings in detail, FIG. 1 is a block diagram of a multifunction network sensor system 10 pursuant to the present invention which comprises multifunction sensors 12, each of which generally includes at least an occupancy sensor 14, an ambient light sensor 16, and a temperature sensor 18, all of which share the same network communications and control processor 20 and the same communication transceiver 22. The multifunction network sensor system 10 further comprises energy management and security controller systems 24, 26, 28, 30 and 32, and a common data communication network 34 which connects to all of the multifunction sensors and controller systems.

Different multifunction sensors 12 (1 to n) can be placed at various locations throughout a building, typically several on each floor level. The multifunction sensors are typically housed in small plastic enclosures such as those illustrated in FIGS. 2, 3 and 4. The occupancy (or motion) sensor 14 technology can be passive infrared (PIR), IR, ultrasonic, sonic, RF, microwave, radar or any other effective occupancy sensing technology. One preferred version is a Passive Infrared (PIR) design which can be used in hallways, rooms/offices or open office cubicles, each provided with a lens designed to optimize the field of view and motion detection for that particular application.

Each multifunction sensor 12 is assigned a unique location address, and is connected to the common data communication network 34 located throughout the building to form a local operating network. Each multifunction sensor 12 can send or receive data, including its own unique address, over the data communication network 34 on a continual periodic basis, such as every 5 seconds, or can respond when polled by an energy management or security controller.

The data communication network 34 is also accessed by control systems requiring such data such as: one or more lighting controllers 24 which require data from one or more of the multifunction sensors 12 on occupancy and ambient light; one or more security controllers 26 which require data from one or more of the multifunction sensors 12 on occupancy or intrusion; one or more HVAC controllers 28 which require data from one or more of the multifunction sensors 12 on occupancy and temperature; one or more DSM controllers 30 which require data from one or more of the multifunction sensors 12 on occupancy, temperature and ambient light; and one or more presence monitors 32 which require data from one or more of the multifunction sensors 12 on occupancy. The lighting, HVAC, DSM and security controllers can comprise one composite controller or individual controllers connected to the common data bus.

The data communication network 34 can use any suitable technology or physical transmission media such as twisted wire pair, power line carrier (PLC), RF, fiber optics, etc., and can employ any suitable common bus data communications protocol such as LONWORKS, CEBus, BacNet, etc.

Each multifunction sensor 12 will generally include sensors for detecting occupancy, ambient light level, and temperature, and can provide optimum cost/function design variations by using all three, any two, or any one of these three basic sensing functions, depending upon the user requirements/application. Each multifunction sensor can also include additional sensors for detecting time-of-day, relative humidity, $CO_2$ and other parameters. However, it should be noted that the mounting and exposure requirements of the diverse parameter sensors in one sensor module are often quite different, such that it is sometimes difficult to mount the diverse sensors in a common sensor module. For instance, a temperature sensor should be mounted to be open and exposed to a flow of air from the environment of a room being monitored, while a passive infrared occupancy sensor should be mounted so as not to be exposed to a flow of air from the environment of the room being monitored. The temperature sensor should also be insulated or shielded from direct exposure to and heat loading from sunlight. U.S. patent application Ser. No. 08/705,778 filed Aug. 30, 1996, discloses and teaches compatible mounting arrangements for a temperature sensor and a passive infrared sensor.

The present invention can use a passive infrared (PIR) sensor such as pyro sensor model no. RE03HBBEC, manufactured by Nippon Ceramic Co., Ltd. of Japan, which detects electromagnetic radiation in the range of 8 to 14 microns. The pyro sensor can be connected to an amplifier such as a dual op-amp circuit model no. TLC27L2CD manufactured by Texas Instruments Inc. of Dallas, Tex.

A preferred type of multifunction passive infrared occupancy sensor is described in detail in copending U.S. patent application Ser. No. 08/738,045, for Multifunction Occupancy Sensor, filed on Oct. 25, 1996, the entire disclosure of which is hereby expressly incorporated by reference herein.

Figure 2:
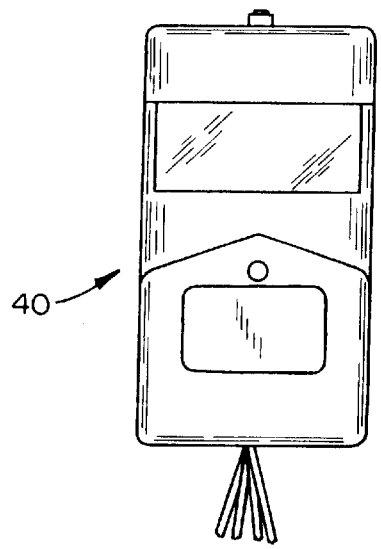
Figure 2A:
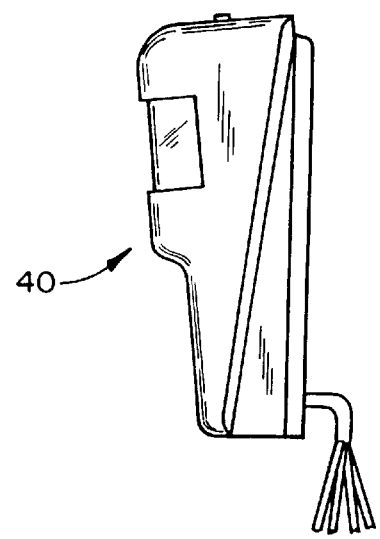
FIGS. 2A, 3A and 4A are respectively side views of the multifunction sensors shown in FIGS. 2, 3 and 4.
Figure 3:
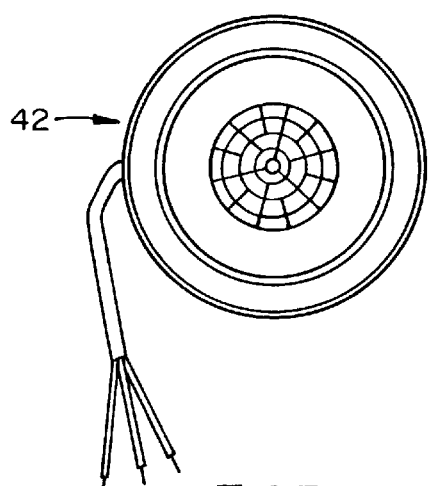
Figure 3A:
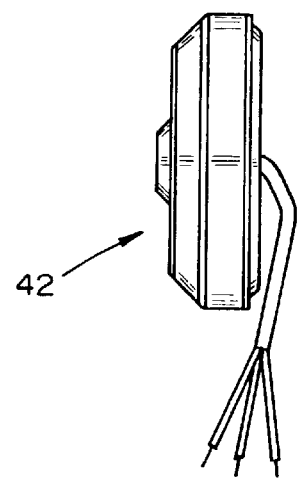
Figure 4:
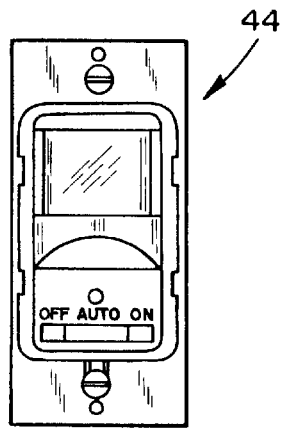
Figure 4A:
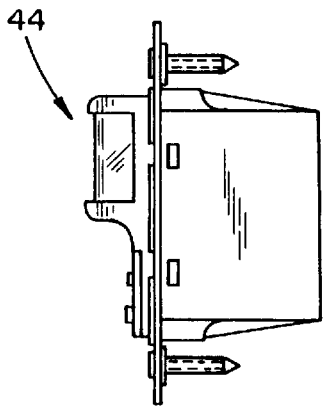

FIGS. 2, 3 and 4 illustrate three different types of multifunction sensors pursuant to the present invention, a wallmount multifunction sensor 40, a ceiling mount multifunction sensor 42, and a wall switch multifunction sensor 44, each of which could be utilized in the multifunction network sensor system of FIG. 1. The wallmount multifunction sensor 40 is similar to the wall switch multifunction sensor 44, except that the wall switch multifunction sensor 44 mounts recessed in a wall switch receptacle box rather than flush upon a wall. The ceiling mount multifunction sensor 42 is similar to units 40 and 44 electrically, but generally will not include a temperature sensor and a front press switch, as shown in FIGS. 4 and 5.

The different wallmount and ceiling mounted multifunction sensors and the segmented lens arrays for the different multifunction sensors are described in detail in copending U.S. patent application Ser. No. 08/736,864, for Multiple Optical Designs For A Multifunction Sensor, filed on Oct. 25, 1996, the entire disclosure of which is hereby expressly incorporated by reference herein.

Figure 5:
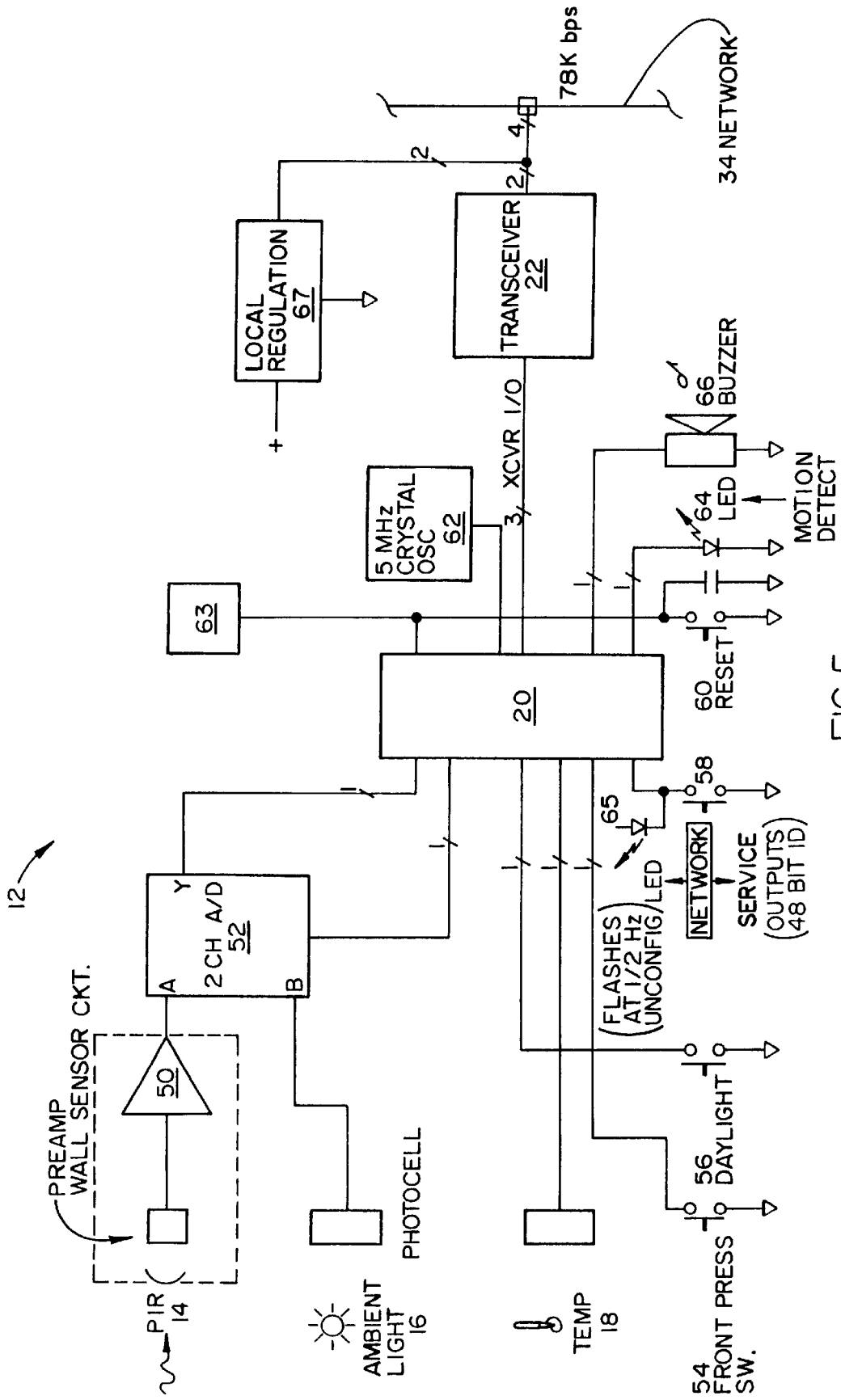
FIG. 5 is a block diagram of the major electronic components of a multifunction sensor pursuant to the present invention.

FIG. 5 is a block diagram of the major electronic components of a multifunction sensor pursuant to the present invention. The multifunction sensor 12 includes an occupancy sensor in the form of a Passive Infrared (PIR) sensor 14, which may particularly be the type of sensor described in copending U.S. patent application Ser. No. 08/738,045, for Multifunction Occupancy Sensor. This type of PIR occupancy sensor can function in a dual mode as either a security occupancy sensor or as an energy management occupancy sensor as disclosed and taught in U.S. patent application 08/738,045. The output of PIR sensor 14 is directed through a preamplifier 50 and forms one input to a two channel A/D converter 52. An ambient light sensor 16, which maybe any suitable type of photodetector, forms a second input to the A/D converter 52. In alternative embodiments, the light sensor may be analog or digital, e.g. light to frequency, and the two channel A/D converter 52 might be replaced by a four channel A/D converter, or an A/D converter having any suitable number of channels. A temperature sensor 18, which maybe a model DS1620 or model DS1820 as available from Dallas Semiconductor, incorporates therein its own conversion from temperature to digital serial output. The multifunction sensor also includes a front press switch 54, which is in the form of a local on/off override switch, and a second press switch 56 which is a daylight set switch and enables a local setting of the ambient light as desired. Other suitable sensors such as a $CO_2$ sensor or a relative humidity sensor or time of day information may also form suitable inputs to this circuit.

The outputs from the A/D converter 52, the temperature sensor 18, and the switches 54 and 56 form inputs to a network communications and control processor 20, which may be a Neuron processor, model 3150 or 3120, as is commercially available from Motorola. A further network service switch 58 is provided for installation of the multifunction sensor when the multifunction sensor is being installed as a node on a network and outputs a unique 48 bit ID particular to the communication and control processor. A press reset switch 60 also forms an input to the processor 20, along with a 5 MHZ crystal oscillator clock 62, and a low voltage drop out detector/power supply supervisory circuit 63. A regulated power supply 67 supplies power to the circuit in general. The outputs of the processor 20 include an output to an LED 64, indicating motion detection, an LED 65 indicating service, and a buzzer 66, if required, to indicate a prelight out warning and/or sensor modes of operation. The processor 20 communicates with the multifunction network sensor system via a transceiver 22, which may be a model FTT-10A, available from Echelon. The output of the transceiver 22 is directed over the data communication network 34 which can be a twisted wire pair, at a typical data rate of 78 Kbps. For a ceiling mounted unit 42, the temperature sensor 18, front press switch 54, and daylight press switch 56 would normally be omitted.

In general, a network based multifunction sensor comprises a single mounted enclosure which provides sensor inputs to the network, such as a PIR or ultrasound occupancy sensor, an ambient light sensor such as a photocell, a temperature sensor, an analog to digital (A/D) converter, installer interface network controls, and one or more network transceivers configurable to any function. For instance, security might be provided in an entirely separate network, and a second transceiver would be provided for the security network. The multifunction sensor can include less or more sensors than the three oasic types of sensors mentioned hereinabove. The design considerations are to reduce costs by minimizing different product types, enclosures, circuit hardware which is mutually exclusive (e.g. Neuron, transceiver) and installation time. Network hardware and software implementations use an appropriate network controller and transceiver e.g. Neuron controller and FTT-10A transceiver for LONTALK protocol, or CEBus network with a CEWay controller including powerline transceiver, etc. The network parameters are defined by the specific network protocol.

Figure 6:
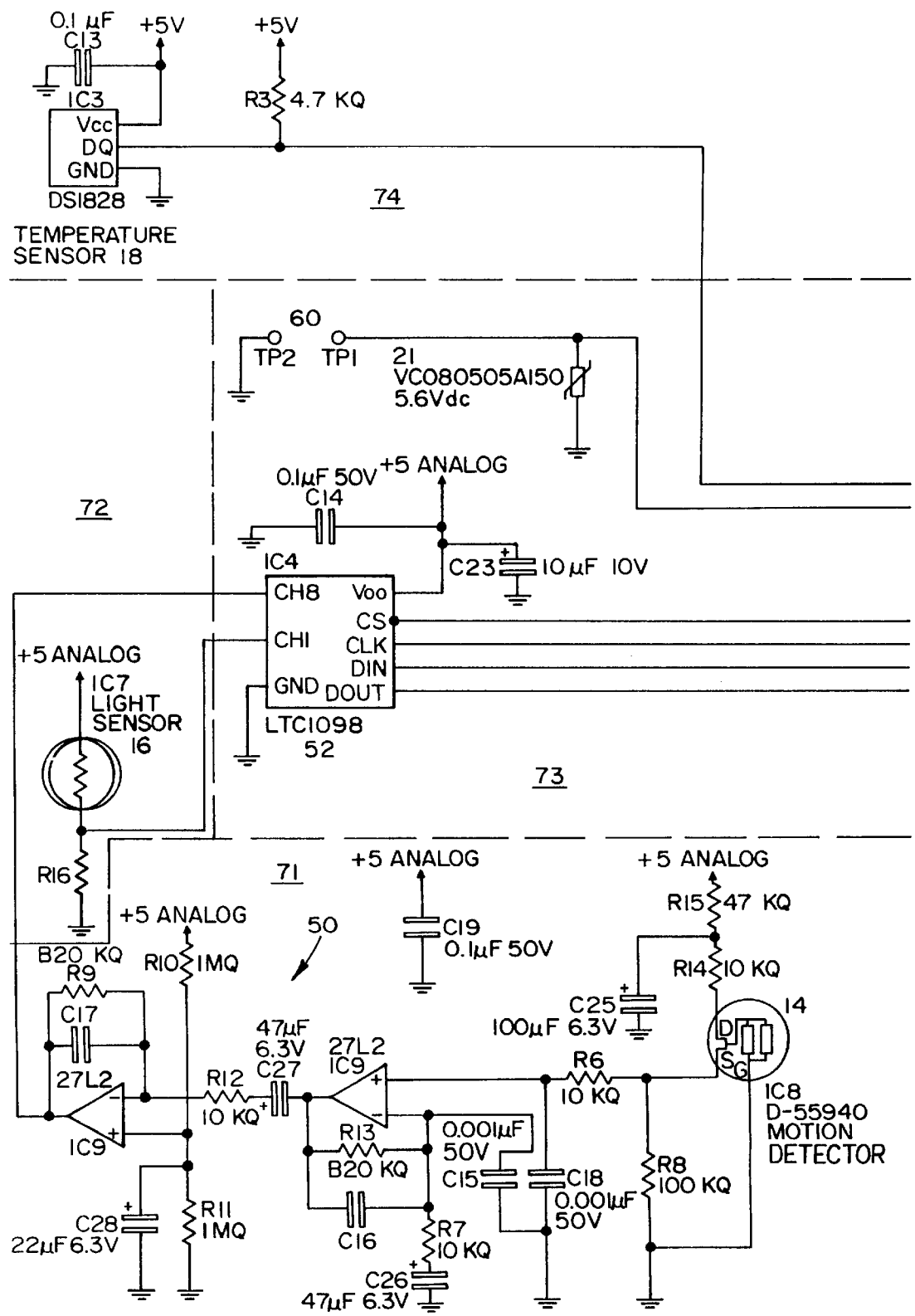
FIGS. 6 and 7 together form an electrical schematic diagram of one designed embodiment of a multifunction sensor pursuant to the present invention.
Figure 7A:
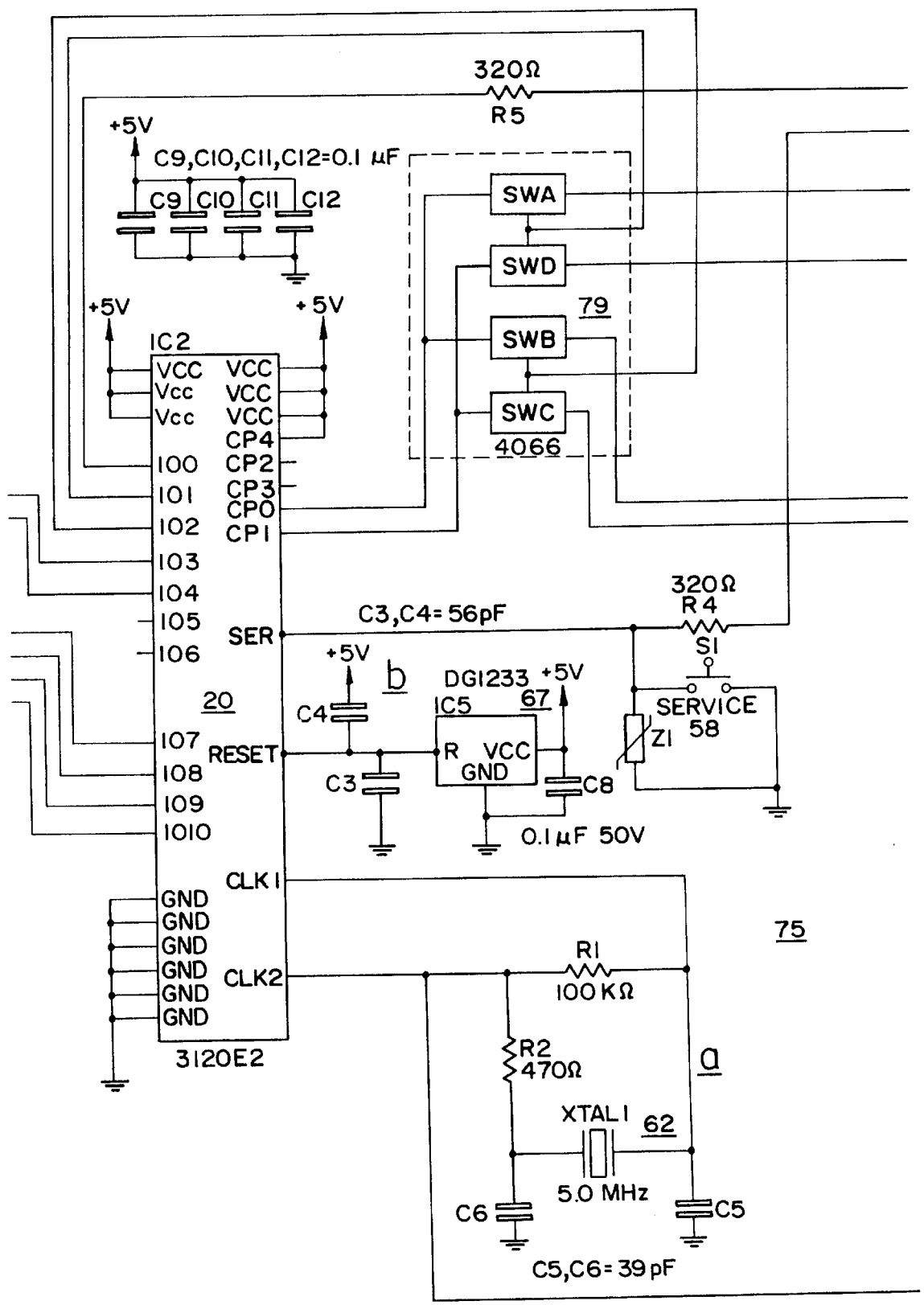
Figure 7B:
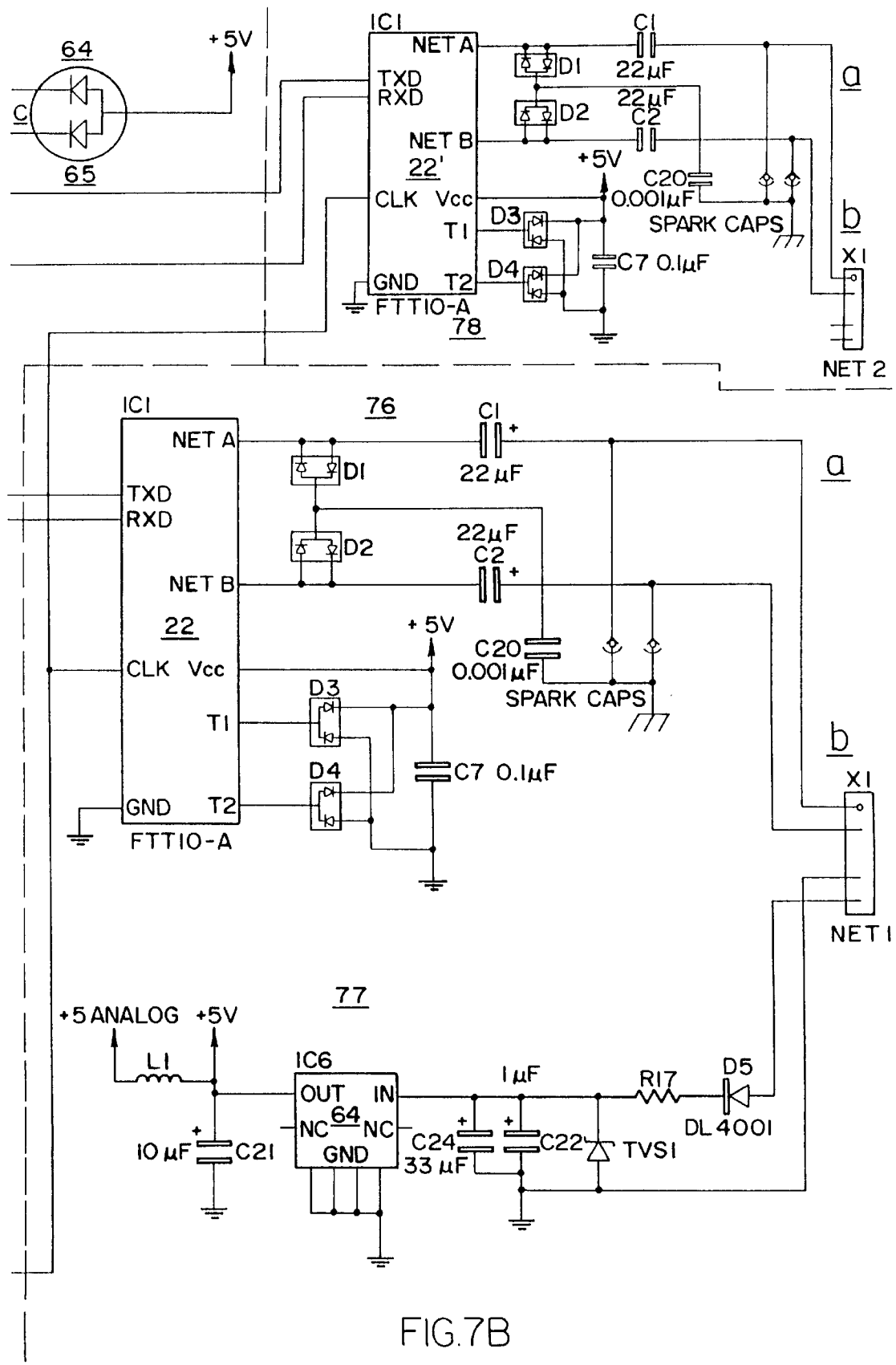

FIGS. 6 and 7 together form an electrical schematic diagram of one embodiment of a multifunction sensor pursuant to the present invention. The electrical schematic diagram of FIGS. 6 and 7 includes the components indicated generally in FIG. 5, and for explanation purposes is divided by dashed lines into sections 71–79.

A section 71 includes the passive infrared (PIR) occupancy sensor 14 (IC8), functioning in a multimode manner as an energy management sensor and/or security sensor.

A section 72 includes an ambient light (AL) sensor 16 (IC7), which provides light level output in lux and/or footcandles of the space.

A section 73 includes an analog to digital converter 52 (IC4) which receives analog inputs from the PIR sensor 14 and AL sensor 16, and converts them to digital outputs for interfacing with the microprocessor.

A section 74 includes a temperature sensor (TS) 18 (IC3), which converts space temperature to a digital serial output signal.

A section 75 includes a microprocessor (uP) 20 which includes data communications and control functions such as processing of LONTALK protocol, the LonWorks Neuron processor 3120 or 3150, or CeBus protocol, such as Intel 8051 processor and CEway, and includes the following subcircuits:

a. an oscillator, microprocessor clock 62;
b. a low voltage dropout detector/supply supervisory circuit 67 (IC5), which controls uP reset line during power up/down and unstable transitions;
c. a service/motion detect LED1 64 and service switch S1 58, bicolor red/green LED, red indicates service mode, green indicates motion detect (flash with motion). The switch (momentary) tells the uP to output the unique device ID e.g. Neuron 48 bit ID code.

A section 76 includes the transceiver 22 network interface and connection. The transceiver converts uP serial I/O and interfaces it to the appropriate network e.g. Free Topology (FTT-10A) 1C1, Twisted Pair (TPT), Power Line (PLT), RF, IR . . . etc. In subcircuit a, the network interface provides conditioning and protection between the units transceiver and the network. In subcircuit b, the connection provides connectivity to the physical network e.g. terminal block, RJ11 phone connector . . . etc.

A section 77 includes the power supply which provides appropriate voltage(s) and current(s) to supply the application.

A section 78 includes a second transceiver, network interface and connection, to provide a second network connection.

A section 79 includes a network selector switch which switches the appropriate sensor information to the correct network.

Figure 8:
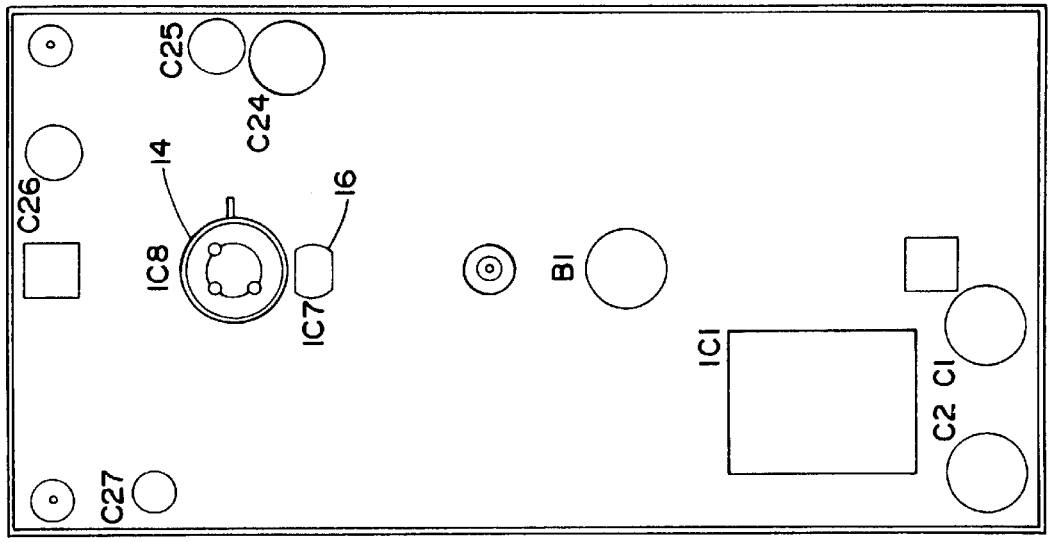
FIGS. 8 and 9 are respectively front and back views of one designed embodiment of a printed circuit board for a multifunction sensor pursuant to the present invention, and illustrate the temperature sensor and passive infrared sensor mounted on opposite sides of the PC board.
Figure 9:
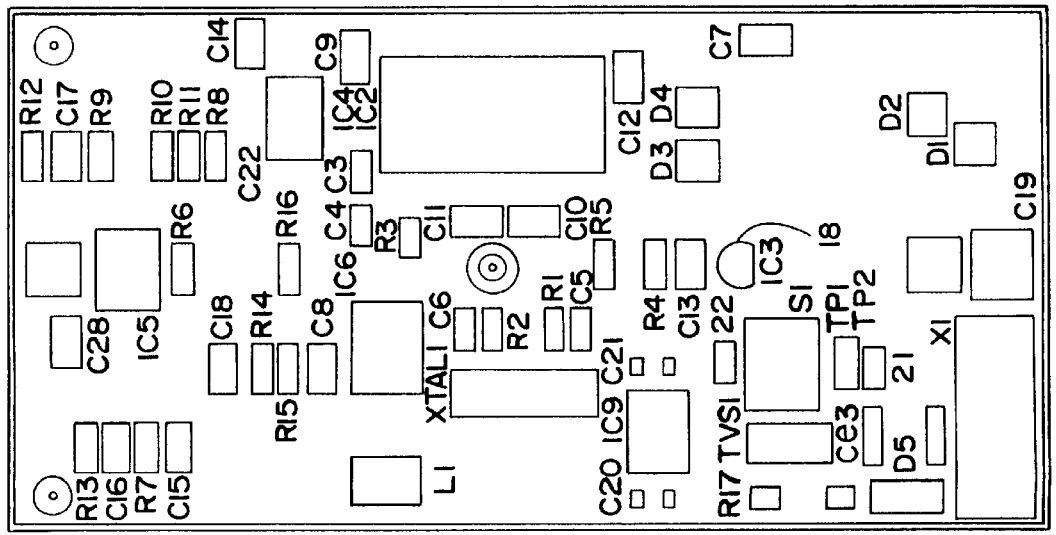

FIGS. 8 and 9 are respectively front and back views of one designed embodiment of a printed circuit board for a multifunction sensor pursuant to the present invention, and illustrate the temperature sensor 18 (1C3) and passive infrared sensor 14 (1C8) mounted respectively on opposite back and front sides of the PC board. The light sensor 16 (1C7) is also mounted adjacent to the PIR sensor 14. The temperature sensor should be mounted to be exposed to a flow of air from the environment of a room being monitored, while the passive infrared occupancy sensor should be mounted so as not to be exposed to a flow of air from the environment of the room being monitored. The temperature sensor should also be insulated or shielded from direct exposure to and heat loading from sunlight. U.S. Pat. application Ser. No. 08/705,778filed Aug. 30, 1996, discloses and teaches compatible mounting arrangements for a temperature sensor and a passive infrared sensor, and in particular discloses in FIGS. 1–3, 5 and 6 suitable arrangements for the PC board of FIGS. 8 and 9.

Figure 10:
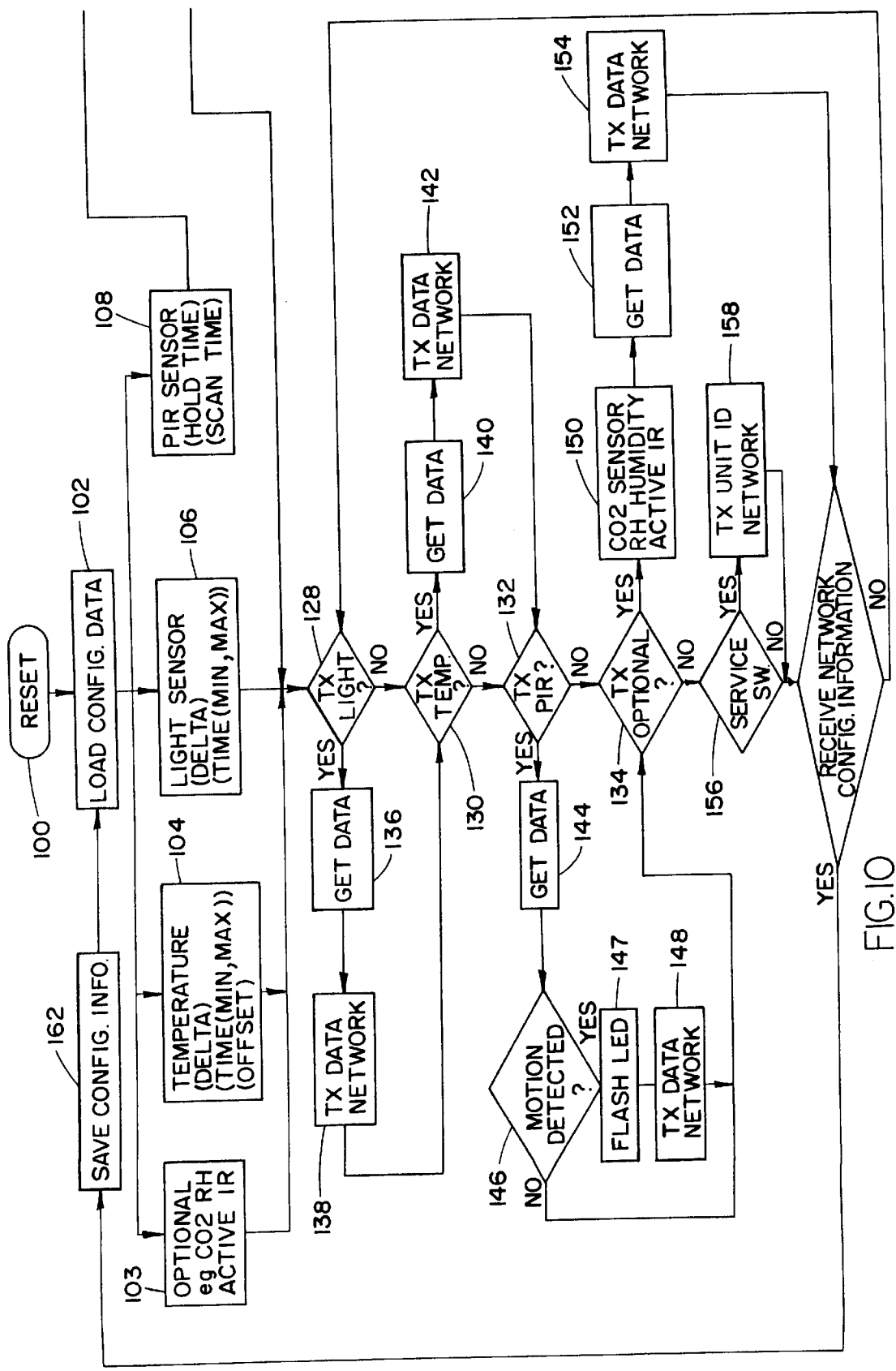
FIGS. 10 and 11 together form a logic flow diagram for operation of a multifunction sensor pursuant to the present invention.
Figure 11:
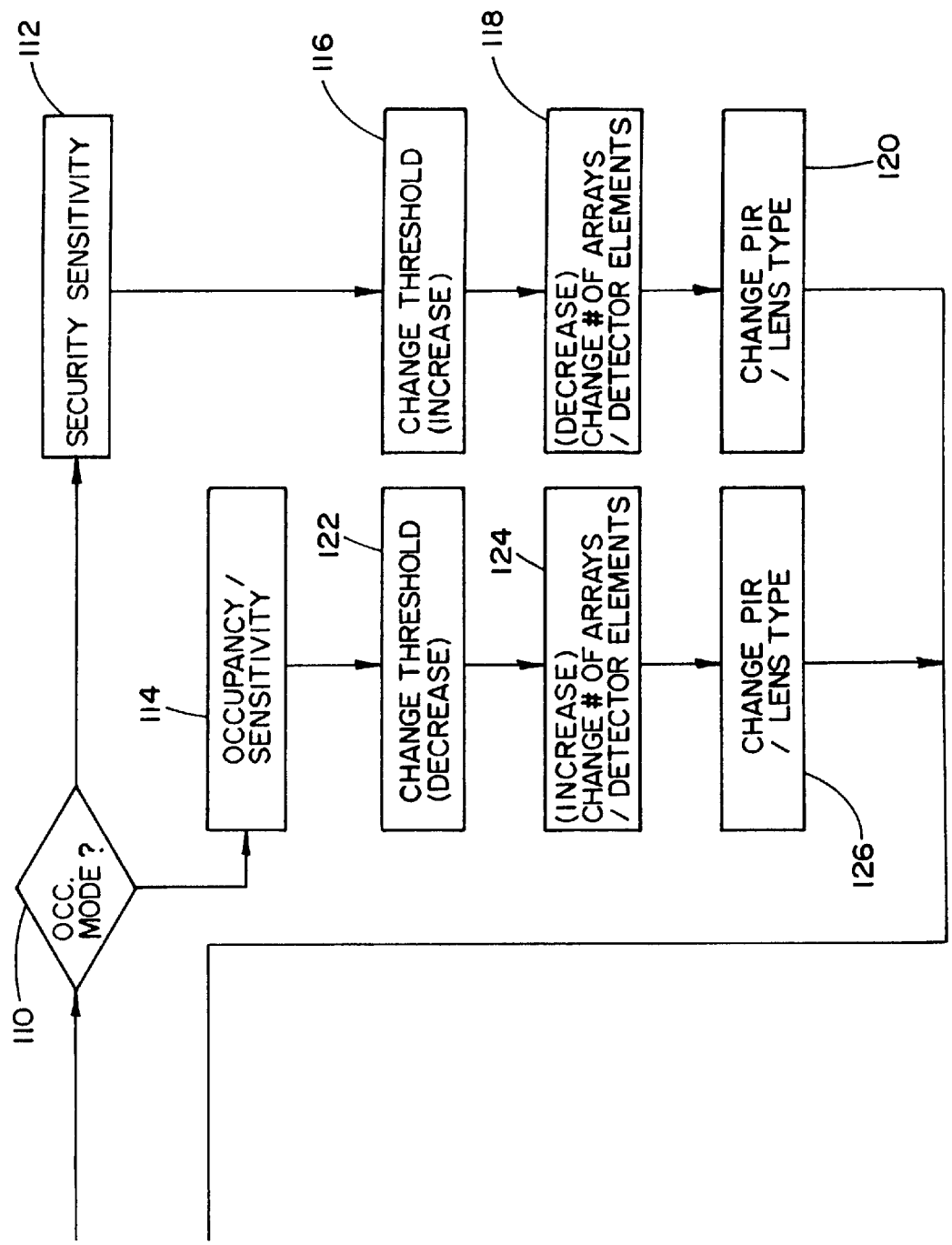

FIGS. 10 and 11 together form a logic flow diagram for operation of a multifunction sensor pursuant to the present invention. A reset block 100 is basically an initialization of the multifunction sensor, and is followed by a load configuration data block 102 which includes the setups for the multifunction sensor, such as definitions for inputs/outputs and definitions of constants.

From block 102, the logic flow diagram branches into an optional block 103 and three blocks 104, 106 and 108 dealing respectively with the temperature sensor, light sensor and occupancy PIR sensor.

The block 104 includes the routine for measuring temperature, and includes configuration for outputting to the network a temperature only when a specified difference (delta) in temperature is reached, and further includes minimum and maximum times for how often temperature is outputted to the network, and an offset to provide for temperature compensation as required. Accordingly, depending upon the rate or magnitude of change of temperature, the actual temperature outputted by the temperature sensor block 104 might be less than or greater than the temperature as sensed within the enclosure.

The block 106 includes the routine for measuring ambient light, and outputs light sensor differences (delta), along with minimum and -maximum times of how often the light level is outputted to the network, and a calibration factor. The light sensor routine output from block 106 will generally be different from the actual light sensor output, with changes in the output being held within set limits. The calibration factor provides an offset to compensate for different factors such as the lens material, a nonlinear photodetector slope, etc.

The PIR sensor routine 108 includes a configuration on how often occupancy updates occur to the network. The scan checks if motion is pending during other routine processing.

To the right of PIR routine 108, a decisional mode block 110 determines which of two modes the occupancy sensor is operating in, a security sensor mode in which case the routine proceeds to block 112, or an energy management mode in which case the routine proceeds to block 114. These different operational modes are described in greater particularity in patent application 08/738,045. The security sensing mode 112 sets a higher threshold value for the output of the PIR sensor, whereas the energy management mode 114 sets a lower threshold for operation of the PIR sensor. Accordingly, following the security sensing mode block 112, in block 116 the threshold is increased. It may also be desirable in the security sensing mode to increase the optical sensitivity of the occupancy sensor for reasons explained in detail in U.S. patent application Ser. No. 08/738,045.

In the energy management occupancy mode indicated by block 114, in the following change threshold block 122, the threshold of the detection circuit is decreased. Likewise, in this mode it may be desirable to decrease the optical sensitivity of the occupancy sensor for reasons explained in detail in U.S. patent application Ser. No. 08/738,045.

Optional block 103 is included in the logic flow diagram in the event additional parameter sensors are added, such as a $Co_2$ sensor or a relative humidity sensor or an active infrared sensor.

Following blocks 103, 104, 106 and 120 or 126, the logic flow diagram proceeds to decisional block 128. The decisional block 128 concerns transmission of data on the sensed ambient light level. This is followed in the logic flow diagram by a decisional block 130 concerning the transmission of data on temperature, which is followed by the decisional block 132 concerning the transmission of data on occupancy, which is followed by the decisional block 134 concerning the transmission of optional data such as data from a $CO_2$ sensor, relative humidity sensor or active infrared sensor.

Returning to decisional block 128, if data on the sensed ambient light level is to be transmitted, the logic flow diagram branches to the left to block 136 to obtain the data from the A/D converter which converts the detected ambient light level to a digital signal, and then to block 128 to transmit the data over the data transmission network 34 wherein the protocol of the communication network is utilized for the data transmission. The data is transmitted over the communication network using the appropriate protocol for the network. For instance in the Echelon LONWORKS system, this is referred to as SNVT, standing for System Network Variable Type.

From either a No decision in block 128 or block 138, the logic flow diagram proceeds to the transmit temperature decisional block 130, and if temperature data is to be transmitted, the logic flow diagram proceeds to the right to a get data block 140, which is similar to get data block 136, and then to a transmit data network block 142, similar to block 138.

From either a No decision in decisional block 130 or block 142, the logic flow diagram proceeds to decisional block 132 involving transmission of data on occupancy. If occupancy data is to be transmitted, the logic flow diagram proceeds to the left to block 144 to obtain the data from the A/D converter, and then proceeds to a motion detected decisional block 146 wherein a decision is made as to whether motion was detected or not. This also depends upon the selected mode of the PIR occupancy sensor, with different threshold values being utilized in the security and energy management modes. If motion was detected, the LED 64 is flashed at block 147, and the data is transmitted over the data transmission network at block 148 similar to at block 138. If no motion was detected in decisional block 146, or following the completion of transmission of data in block 148, the logic flow diagram proceeds to decisional block 134 for the transmission of data from any optional sensors, such as a $Co_2$ sensor, relative humidity sensor or active infrared sensor at block 150. The logic flow diagram then proceeds to block 152 wherein the data is obtained, similar to block 136, and then to block 144 wherein the data is transmitted over the network, similar to block 138.

If the decision in decisional block 134 is No, the service switch is checked at block 156. If the service switch is operated, the unit's 48 bit unique identification number is transmitted over the data network at block 158. From either a No decision in block 156 or following blocks 158 or 154, the logic flow diagram proceeds to block 160, wherein a decision is made to whether network configuration information data has been received. This involves for instance data information from installation tools, wherein nodes may be added to the network, and also involves information and settings including application codes. If no network configuration information data has been received, the logic flow diagram proceeds back to block 128 to recycle back through the logic flow diagram. If network configuration information data has been received, the logic flow diagram proceeds to block 162, in which the network configuration information data is saved, and then back to block 102, in which the received network configuration information data is loaded into application memory. As stated previously, the network configuration information data includes data on setups (e.g. delta, min/max etc.) definitions for inputs, definitions of constants, etc., all as defined in the particular data communication network. The logic flow diagram then recycles back through itself.

One multifunction sensor with common data communications can replace many traditional individual sensors. Moreover, it enables much improved logic and decision making in building automation and control, including maximum performance in energy management and peak demand control as are used in Demand Side Management (DSM) systems. A low cost system design optimizes load shedding for electrical DSM systems by sensing and communicating occupancy, temperature and ambient light data to the DSM controller. Moreover, energy management and peak demand monitoring and control is optimized by the provision of simultaneous information on occupancy status, ambient temperature and light levels. This enables the HVAC, DSM and lighting controllers to make optimum decisions on shedding various HVAC, lighting, and other electrical loads, while simultaneously providing occupancy information for security monitoring and control. The multifunction sensor maximizes many systems' performance conveniently and economically.

For example, if peak energy demand is exceeded in the summer and temperatures and ambient light levels are high, then lighting loads can be shed in areas with sufficient ambient light. If demand is still exceeded, A/C loads can also be shed in those areas or zones which are unoccupied. In winter, the multifunction sensor can similarly optimize energy management of heating, lighting and other loads. Moreover, the multifunction sensor can provide detailed occupancy information to the security controller in the case of fire. In the case of unwanted intrusion, occupancy sensing can trigger the security controller during nonworking hours for an appropriate alarm with location/address information of the intruders and also trigger the lighting controller as needed.

While several embodiments and variations of the present invention for a multifunction sensor and network sensor system are described in detail herein, it should be apparent that the disclosure and teachings of the present invention will suggest many alternative designs to those skilled in the art.

What is claimed is:

1. A multifunction sensor module providing a plurality of parameter sensors in one sensor module housing which can interface with and control operation of one or more building automation controllers in a networked building, comprising:
   a. a single sensor module housing for enclosing and housing
      i. an occupancy sensor,
      ii. an ambient light sensor,
      iii. a temperature sensor,
      iv. a common network communications and control processor coupled to a common communication transceiver which are shared in common by the occupancy sensor, the ambient light sensor, and the temperature sensor, and wherein the multifunction sensor is assigned a unique location address; and
   b. the common transceiver includes means for transmitting and receiving data over a local operating network employing a distributed control system date, communication protocol and a common system bus connected in a distributed control system, which includes a plurality of sensors and a plurality of building automation controllers for the building, wherein each controller receives data over the system bus directly from one or more sensors, and the transmitting and receiving means includes means for directly interfacing with and transmitting data directly to one or more of the controllers, and the transmitting and receiving means further includes means for receiving data, including its own unique address and data for sensor node configurations, over the system bus.

2. Apparatus as claimed in claim 1, wherein the transmitting and receiving means includes means for employing a carrier sense multiple access (CSMA) data communications protocol.

3. Apparatus as claimed in claim 1 wherein the transmitting and receiving means receives data on sensor node configuration from network installation and configuration tools.

4. Apparatus as claimed in claim 1 wherein the occupancy sensor comprises a passive infrared sensor, and further including means for mounting the temperature sensor to be open and exposed to a flow of air from an environment being monitored, and means for mounting the passive infrared sensor secluded from the temperature sensor in a position not exposed to a flow of air from the environment being monitored.

5. Apparatus as claimed in claim 4, wherein the temperature sensor is shielded from direct exposure to and heat from sunlight.

6. Apparatus as claimed in claim 4, wherein the temperature sensor and passive infrared sensor are mounted respectively on opposite back and front sides of a printed circuit board.

7. A multifunction sensor as claimed in claim 6, wherein the ambient light sensor is also mounted on the front of the printed circuit board.

8. Apparatus as claimed in claim 1, wherein the occupancy sensor comprises a passive infrared sensor which provides a first occupancy output signal for security systems and a second different occupancy output signal for energy management control systems.

9. Apparatus as claimed in claim 1, wherein the multifunction sensor comprises a wallmount multifunction sensor mounted upon a wall or in a corner.

10. Apparatus as claimed in claim 1, wherein the multifunction sensor comprises a ceiling mount multifunction sensor mounted upon a ceiling.

11. Apparatus as claimed in claim 1, wherein the multifunction sensor comprises a wall switch multifunction sensor mounted recessed in a wall switch receptacle box mounted recessed in a wall.

12. Apparatus as claimed in claim 1, in combination with the distributed control system local operating network which includes a plurality of the controllers and a plurality of the multifunction sensors which are placed at different locations throughout the building.

13. Apparatus as claimed in claim 12, wherein each transmitting and receiving means includes means for employing a carrier sense multiple access (CSMA) data communications protocol.

14. Apparatus as claimed in claim 12, wherein the transmitting and receiving means receives data on sensor node configuration from network installation and configuration tools.

15. Apparatus as claimed in claim 12, wherein the plurality of multifunction sensors includes a wallmount multifunction sensor mounted upon a wall or in a corner, a ceiling mount multifunction sensor mounted upon a ceiling, and a wall switch multifunction sensor mounted recessed in a wall switch receptacle box mounted recessed in a wall.

16. Apparatus as claimed in claim 12, wherein the local operating network includes one or more lighting controllers which receive data on occupancy and ambient light from one or more of the multifunction sensors.

17. Apparatus as claimed in claim 12, wherein the local operating network includes one or more security controllers which receive data on occupancy or intrusion from one or more of the multifunction sensors.

18. Apparatus as claimed in claim 12, wherein the local operating network includes one or more heating, ventilation and air conditioning controllers which receive data on occupancy and temperature from one or more of the multifunction sensors.

19. Apparatus as claimed in claim 12, wherein the local operating network includes one or more demand side management controllers which control and manage electrical loads dependent upon electrical demand and which receive data on occupancy, temperature and ambient light from one or more of the multifunction sensors.

20. Apparatus as claimed in claim 12, wherein the local operating network includes one or more presence monitors which receive data on occupancy from one or more of the multifunction sensors.

21. Apparatus as claimed in claim 12, wherein the data communication network is connected by a twisted wire pair.

22. Apparatus as claimed in claim 12, wherein each occupancy sensor comprises a passive infrared sensor, and further including means for mounting the temperature sensor to be open and exposed to a flow of air from an environment being monitored, and means for mounting the passive infrared sensor secluded from the temperature sensor in a position not exposed to a flow of air from the environment being monitored.

23. Apparatus as claimed in claim 22, wherein the temperature sensor is shielded from direct exposure to and heat from sunlight.

24. Apparatus as claimed in claim 22, wherein the temperature sensor and the passive infrared sensor are mounted respectively on opposite back and front sides of a printed circuit board.

25. Apparatus as claimed in claim 24, wherein the ambient light sensor is also mounted on the front of the printed circuit board.

* * * * *